(12) United States Patent
Tong et al.

(10) Patent No.: US 11,310,606 B2
(45) Date of Patent: Apr. 19, 2022

(54) MEMS MICROPHONE

(71) Applicant: AAC ACOUSTIC TECHNOLOGIES (SHENZHEN) CO., LTD., Shenzhen (CN)

(72) Inventors: Bei Tong, Shenzhen (CN); Zhan Zhan, Shenzhen (CN); Yang Li, Shenzhen (CN); Kahkeen Lai, Singapore (SG); Xiaohui Zhong, Singapore (SG); Lian Duan, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/986,304

(22) Filed: Aug. 6, 2020

(65) Prior Publication Data

US 2020/0413204 A1 Dec. 31, 2020

Related U.S. Application Data

(63) Continuation of application No. PCT/CN2019/093949, filed on Jun. 29, 2019.

(51) Int. Cl.
| | |
|---|---|
| *H04R 23/00* | (2006.01) |
| *H04R 23/02* | (2006.01) |
| *B81B 3/00* | (2006.01) |
| *H04R 7/06* | (2006.01) |
| *H04R 17/02* | (2006.01) |
| *H04R 19/04* | (2006.01) |

(52) U.S. Cl.
CPC ........... *H04R 23/02* (2013.01); *B81B 3/0021* (2013.01); *H04R 7/06* (2013.01); *H04R 17/02* (2013.01); *H04R 19/04* (2013.01); *B81B 2201/0257* (2013.01); *B81B 2203/0127* (2013.01); *B81B 2203/0315* (2013.01); *B81B 2203/04* (2013.01); *H04R 2201/003* (2013.01)

(58) Field of Classification Search
CPC .......... H04R 23/02; H04R 7/06; H04R 17/02; H04R 19/04; H04R 2201/003; H04R 19/005; B81B 3/0021; B81B 2201/0257; B81B 2203/0127; B81B 2203/0315; B81B 2203/04
See application file for complete search history.

(56) References Cited

U.S. PATENT DOCUMENTS

| | | | |
|---|---|---|---|
| 2016/0219378 A1* | 7/2016 | Hall | H04R 19/04 |
| 2017/0265009 A1* | 9/2017 | Sridharan | H04R 17/02 |
| 2019/0219468 A1* | 7/2019 | Duqi | G01L 9/0054 |

* cited by examiner

*Primary Examiner* — Matthew A Eason
(74) *Attorney, Agent, or Firm* — W&G Law Group

(57) ABSTRACT

The present disclosure provides an MEMS microphone including a base having a rear cavity and a capacitor system disposed on the base. The capacitor system includes a rear plate and a diaphragm that are spaced relatively apart to form an acoustic cavity. A piezoelectric diaphragm is attached to a side of the diaphragm, the side being away from the acoustic cavity. The piezoelectric diaphragm, under the deformation effect of the diaphragm, deforms to generate and output charges. Therefore, the MEMS microphone can output two groups of electrical signals, one group of electrical signals output by the capacitor system and one group of electrical signals output by the piezoelectric diaphragm, thereby sensitivity of the microphone is improved.

8 Claims, 1 Drawing Sheet

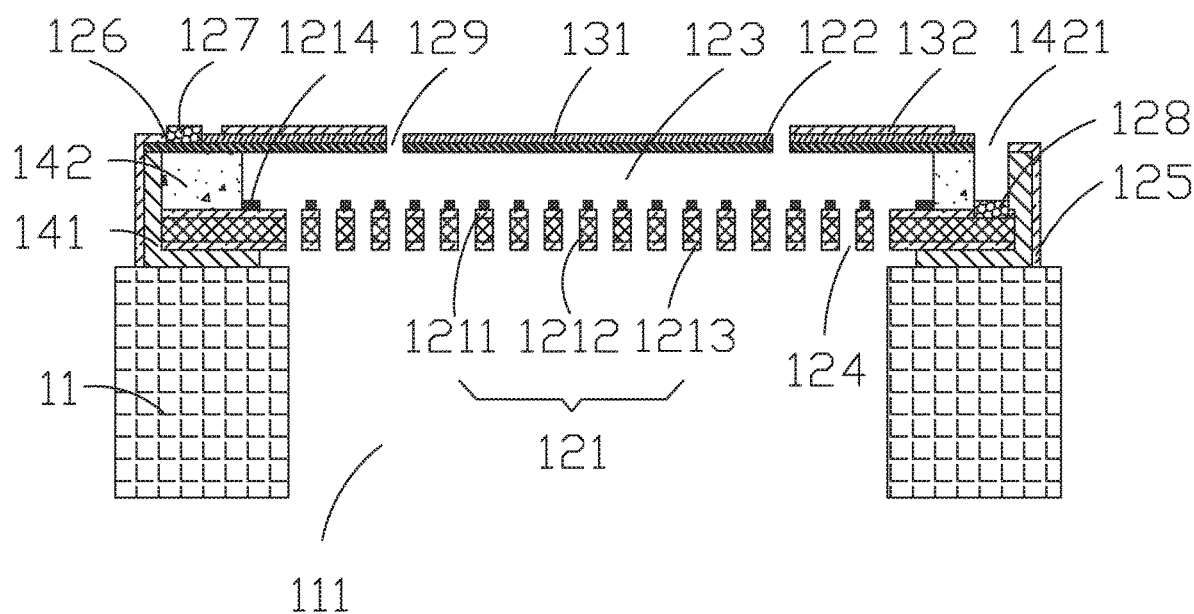

MEMS MICROPHONE

TECHNICAL FIELD

The present disclosure relates to the technical field of electroacoustic transducer device, in particular an MEMS microphone.

BACKGROUND

Micro-electro-mechanical system (MEMS) microphone is an electroacoustic transducer manufactured by using a micro-mechanical processing technology, and is characterized by small size, good frequency response, low noise, etc. With the development of smaller and thinner electronic devices, MEMS microphone is more and more widely applied to these devices.

An MEMS microphone in related technologies includes a silicon substrate and a flat capacitor composed of a diaphragm and a rear plate. The diaphragm and the rear plate are opposite to each other and separated by a certain distance. The diaphragm vibrates under sound waves, causing the distance between the diaphragm and the rear plate to change, rendering that capacitance of the flat capacitor changes, thereby transducing a sound wave signal into an electrical signal. At present, capacitive MEMS microphones seem to have reached a performance bottleneck, and there has been no considerable improvement in recent years. In addition, the performance of this kind of MEMS microphone is greatly affected by dust, water and pollutants, and reliability of this kind of MEMS microphone may become poor when the diaphragm is working in an environment with high sound pressure.

Therefore, it is necessary to provide a new MEMS microphone to address the above issue.

SUMMARY

The objective of the present disclosure is to provide an MEMS microphone having highly sensitive.

The technical solutions of the present disclosure are as follows:

An MEMS microphone includes a base having a rear cavity and a capacitor system provided on the base. The capacitor system includes a rear plate and a diaphragm that are spaced relatively apart to form an acoustic cavity. Herein a piezoelectric diaphragm is attached to a side of the diaphragm, the side being away from the acoustic cavity.

As an improvement, a side of the piezoelectric diaphragm is provided with a pressed film electrode, the side being away from the acoustic cavity.

As an improvement, the pressed film electrode is a loop.

As an improvement, the diaphragm and the piezoelectric diaphragm are correspondingly provided with a through hole that is in communication with the acoustic cavity.

As an improvement, the rear plate is provided with an acoustic hole through which the acoustic cavity and the rear cavity are in communication.

As an improvement, the rear plate includes a first protection layer, a rear plate layer and a second protection layer that are superimposed in order, the first protection layer facing the acoustic cavity and the acoustic hole passing through the first protection layer, the rear plate layer and the second protection layer.

As an improvement, a surface of the first protection layer is provided with an insulating protrusion that is configured to prevent the rear plate from sticking to the diaphragm, the surface facing the acoustic cavity.

As an improvement, a first insulating layer is provided between the capacitor system and the base, the first insulating layer being connected with the capacitor system or the base, a second insulating layer is provided between the diaphragm and the rear plate, and the second insulating layer is connected with the diaphragm or the rear plate.

As an improvement, an outer side of the first insulating layer and second insulating layer is provided with a third protection layer.

The present disclosure is advantageous in that, compared with the existing technologies, the MEMS microphone of the present disclosure couples a piezoelectric diaphragm structure in the capacitor system. In a power-on operation state of the MEMS microphone, when the diaphragm generates vibration due to sound waves, a distance between the diaphragm and the rear plate may change, causing a change to capacitance of the capacitor system, so that a sound wave signal is transduced into an electrical signal, and a function of the microphone is correspondingly realized. Besides, the piezoelectric diaphragm, under the deformation effect of the diaphragm, deforms to generate and output charges. That is, the MEMS microphone of the present disclosure can output two groups of electrical signals, one group of electrical signals output by the capacitor system and one group of electrical signals output by the piezoelectric diaphragm, thereby sensitivity of the microphone is improved.

BRIEF DESCRIPTION OF THE DRAWING

FIG. 1 is a cross-sectional view of an MEMS microphone according to an embodiment of the present disclosure.

DETAILED DESCRIPTION

In order to make the purpose, the technical solution and the advantages of the present disclosure clearer, the present disclosure will be explained below in detail with reference to the accompanying drawings and embodiments. It shall be understood that the specific embodiments described here only explain the present disclosure but do not put a limitation to the present disclosure. Based on embodiments in the present disclosure, all other embodiments obtained by those ordinarily skilled in the art without any inventive effort fall into the scope of protection by the present disclosure.

The terms of "first", "second", "third" and "fourth", etc. (if any) in the specification, claims and drawing of the present disclosure are used to distinguish similar objects without having to describe a particular order or sequence. It shall be appreciated that the data used in this way may be interchanged under appropriate circumstances so that the embodiments described herein can be implemented in an order other than the content illustrated or described herein. In addition, the terms of "including" and "having" and any variations thereof are intended to cover non-exclusive inclusions. For example, a process, method, system, product or device that includes a series of steps or units is not necessarily limited to the clearly listed steps or units, but may include other steps or units that are not clearly listed or are inherent to the process, method, product, or device.

It shall be noted that descriptions including "first", "second", etc. in the present disclosure are only for descriptive purposes, and cannot be understood as indicating or implying their relative importance or implicitly indicating the number of indicated technical features. Therefore, the features defined with "first" and "second" may explicitly or implicitly include at least one of the features. Further, technical solutions of various embodiments can be combined with each other, but they must be based on what can be achieved by those of ordinary skill in the art. When there is a conflict to a combination of technical solutions or the technical solutions cannot be achieved, it shall be considered that such a combination of technical solutions does not exist and is not within the protection scope of the present disclosure.

Referring to FIG. 1, an embodiment of the present disclosure provides an MEMS microphone 10, including a base 11 and a capacitor system disposed on the base 11 and is insulated and connected with the base 11.

The base 11 is made of semiconductor material, having a rear cavity 111, an upper surface and a lower surface opposite to the upper surface. The rear cavity 111 communicates with both the upper surface and the lower surface. The rear cavity 111 may be formed through a bulk silicon micro-machining process or through etching.

A first insulating layer 141 is provided between the capacitor system and the base 11. The first insulating layer 141 may not only support the capacitor system, but also ensure insulation between the capacitor system and the base 11.

The capacitor system includes a rear plate 121, a diaphragm 122 that is disposed separate from and opposite to the rear plate 121, and a second insulating layer 142 that is located between the rear plate 121 and the diaphragm 122. The rear plate 121 and the diaphragm 122 are disposed as separated from each other and form an acoustic cavity 123. The acoustic cavity 123 passes through the second insulating layer 142 which may not only have a support function, but also ensure insulation between the diaphragm 122 and the rear plate 121. The rear plate 121 includes a first protection layer 1211, a rear plate layer 1212 and a second protection layer 1213 that are superimposed in order. The first protection layer 1211 faces the acoustic cavity 123. A surface of the first protection layer 1211 is provided with an insulating protrusion 1214 that is configured to prevent the rear plate 121 from sticking to the diaphragm 122, the surface facing the acoustic cavity 123. A piezoelectric diaphragm 131 is disposed at a side of the diaphragm 122, the side being away from the acoustic cavity 123. A side of the piezoelectric diaphragm 131 is provided with a pressed film electrode 132, the side being away from the acoustic cavity 123. Under a deformation effect of the diaphragm 122, the piezoelectric diaphragm 131 deforms to generate and output charges.

An outer side of the first insulating layer 141 and second insulating layer 142 is provided with a third protection layer 125. The first protection layer 1211, the second protection layer 1213 and third protection layer 125 are all made of such materials as monocrystalline silicon, polycrystalline silicon, silicon nitride, etc. for protection.

The first insulating layer 141 and the second insulating layer 142 are both made of semiconductor silicon oxide insulating layer material.

Both the rear plate 121 and the diaphragm 122 are conductive and are made of conductive materials mixed with polycrystalline silicon or monocrystalline silicon. In a power-on operation state of the MEMS microphone, the rear plate 121 and the diaphragm 122 may carry charges with opposite polarities to form a capacitor system. When the diaphragm 122 generates vibration due to sound waves, a distance between the diaphragm 122 and the rear plate 121 may change, causing a change to capacitance of the capacitor system, so that an acoustic signal is transduced into an electrical signal, and a function of the microphone is correspondingly realized. Besides, the piezoelectric diaphragm 131, under the deformation effect of the diaphragm 122, deforms to generate and output charges. That is, the MEMS microphone 10 in this embodiment can output two groups of electrical signals, one group of electrical signals output by the capacitor system and one group of electrical signals output by the piezoelectric diaphragm 131, thereby sensitivity of the microphone is improved.

Positions of the rear plate 121 and of the diaphragm 122 may be adjusted, as long as the two may form a capacitor system. That is, the rear plate 121 may be located between the diaphragm 122 and the base 11, or the diaphragm 122 may be located between the rear plate 121 and the base 11.

In this embodiment, the rear plate 121 is located between the diaphragm 122 and the base 11. The first insulating layer 141 is provided between the rear plate 121 and the base 11. The first insulating layer 141 is connected with the rear plate 121 or the base 11. The rear plate 121 is provided with an acoustic hole 124 through which the acoustic cavity 123 and the rear cavity 111 are in communication. The acoustic hole 124 passes through the first protection layer 1211, the rear plate layer 1212 and the second protection layer 1213. The piezoelectric diaphragm 131 and the third protection layer 125 form a first connecting hole 126. The second insulating layer 142 is provided with a second connecting hole 1421 that passes through the second insulating layer 142. The first connecting hole 126 is provided with a diaphragm electrode 127 connected with the diaphragm 122. The second connecting hole 1421 is provided with a rear plate electrode 128 connected with the rear plate 121. In other embodiments, positions of the diaphragm electrode 127 and of the rear plate electrode 128 are adjusted along with positions of the rear plate 121 and of the diaphragm 122.

Preferably, the pressed film electrode 132 is a loop. When the diaphragm 122 is vibrating, stress on an edge of the diaphragm 122 is the greatest. Therefore, the piezoelectric diaphragm 131 and the pressed film electrode 132 are best further deposited on the edge. The piezoelectric diaphragm 131 is deformed due to deformation of the diaphragm 122, and a piezoelectric effect generated at the edge of the diaphragm 122 is the most obvious. Therefore, the pressed film electrode 132 may be designed as a loop, for example, a ring or a -shaped. A center of the pressed film electrode 132 and a center of the piezoelectric diaphragm 131 are on one vertical line.

Preferably, the diaphragm 122 and the piezoelectric diaphragm 131 are correspondingly provided with a through hole 129, so that when the diaphragm 122 vibrates, it is easier for current generated between the diaphragm 122 and the rear plate 121 to leak, thereby reducing noise of the microphone and increasing a signal-to-noise ratio thereof. Alternatively, in other embodiments, the through hole 129 passing through the piezoelectric diaphragm 131 may have other functions. For example, when sound spreads from the piezoelectric diaphragm 131 to the diaphragm 122 rather than from the rear cavity 111 to the diaphragm 122, the objective of providing the through hole 129 through the piezoelectric diaphragm 131 is to enable sound to reach the diaphragm 122.

A method for manufacturing the MEMS microphone in an embodiment of the present disclosure specifically includes the following steps:

Step S1, a rear plate wafer is made, including:

Step S11, the base 11, the second protection layer 1213, the rear plate layer 1212, the first protection layer 1211 and an insulating protrusion layer are provided and are superimposed in order to form a rear plate wafer;

Step S12, the rear plate wafer is etched. The second protection layer 1213, the rear plate layer 1212, the first protection layer 1211 and a central body region of the insulating protrusion 1214 are etched to form the acoustic hole 124 that passes through the second protection layer 1213, the rear plate layer 1212, the first protection layer 1211 and the insulating protrusion 1214, and the insulating protrusion layer is divided by the acoustic hole 124 into a plurality of insulating protrusions 1214, thereby the rear plate wafer is formed;

Step S2, a diaphragm wafer is made, including:

Step S21, a gap of the rear plate wafer is filled with a semiconductor silicon oxide insulating layer material, and the rear plate wafer is polished to form the second insulating layer 142;

Step S22, depositing on and etching the second insulating layer 142 is performed to form the diaphragm 122;

Step S23, depositing on and etching a side of the diaphragm 122 is performed to form the piezoelectric diaphragm 131, the side being away from the rear plate wafer;

Step S24, depositing on and etching a side of the piezoelectric diaphragm 131 is performed to form the pressed film electrode 132, the side being away from the diaphragm 122, thereby forming the diaphragm wafer;

Step S3, etching is performed to form the first connecting hole 126 that passes through the piezoelectric diaphragm 131 and the second connecting hole 1421 that passes through the second insulating layer 142; and the third protection layer 125 is deposited on an outer side of the first insulating layer 141 and second insulating layer 142;

Step S4, a bottom of the base 11 is etched to form the rear cavity 111 that is adjacent to the second protection layer 1213;

Step S5, a central body region of the second insulating layer 142 is thinned to form the acoustic cavity 123 and the acoustic hole 124 that pass through the second insulating layer 142, and the acoustic cavity 123, the acoustic hole 124 and the rear cavity 111 are in communication;

Step S6, etching is performed in the first connecting hole 126 and the second connecting hole 1421 respectively to form two connecting discs which are then gold-oxidized to form the diaphragm electrode 127 in the first connecting hole 126 and the rear plate electrode 128 in the second connecting hole 1421;

Step S7, manufacturing of the MEMS microphone is completed.

The method for manufacturing the MEMS microphone is characterized by simple processing, low cost and easy batch production.

The above are only embodiments of the present disclosure. It shall be indicated that those of ordinary skill in the art can make improvements without departing from the creative concept of the present disclosure, and these belong to the protection scope of the present disclosure.

What is claimed is:

1. An MEMS microphone, comprising
a base having a rear cavity, and
a capacitor system disposed on the base;
the capacitor system comprising a rear plate and a diaphragm that are spaced relatively apart to form an acoustic cavity;
wherein a piezoelectric diaphragm is attached to a side of the diaphragm, the side being away from the acoustic cavity;
a first insulating layer is provided between the capacitor system and the base, the first insulating layer being connected with the capacitor system or the base, a second insulating layer is provided between the diaphragm and the rear plate, and the second insulating layer is connected with the diaphragm or the rear plate.

2. The MEMS microphone according to claim 1, wherein a side of the piezoelectric diaphragm is provided with a pressed film electrode, the side being away from the acoustic cavity.

3. The MEMS microphone according to claim 2, wherein the pressed film electrode is a loop.

4. The MEMS microphone according to claim 1, wherein the diaphragm and the piezoelectric diaphragm are correspondingly provided with a through hole that is in communication with the acoustic cavity.

5. The MEMS microphone according to claim 1, wherein the rear plate is provided with an acoustic hole through which the acoustic cavity and the rear cavity are in communication.

6. The MEMS microphone according to claim 5, wherein the rear plate comprises a first protection layer, a rear plate layer and a second protection layer that are superimposed in order, the first protection layer facing the acoustic cavity and the acoustic hole passing through the first protection layer, the rear plate layer and the second protection layer.

7. The MEMS microphone according to claim 6, wherein a surface of the first protection layer is provided with an insulating protrusion that is configured to prevent the rear plate from sticking to the diaphragm, the surface facing the acoustic cavity.

8. The MEMS microphone according to claim 1, wherein an outer side of the first insulating layer and second insulating layer is provided with a third protection layer.

\* \* \* \* \*